United States Patent
Iwane et al.

(10) Patent No.: US 10,928,458 B2
(45) Date of Patent: Feb. 23, 2021

(54) SECONDARY BATTERY STATE DETECTION DEVICE AND SECONDARY BATTERY STATE DETECTION METHOD

(71) Applicants: FURUKAWA ELECTRIC CO., LTD., Tokyo (JP); FURUKAWA AUTOMOTIVE SYSTEMS INC., Shiga (JP)

(72) Inventors: Noriyasu Iwane, Tokyo (JP); Atsuhito Higuchi, Tokyo (JP)

(73) Assignees: FURUKAWA ELECTRIC CO., LTD., Tokyo (JP); FURUKAWA AUTOMOTIVE SYSTEMS INC., Shiga (JP)

( * ) Notice: Subject to any disclaimer, the term of this patent is extended or adjusted under 35 U.S.C. 154(b) by 22 days.

(21) Appl. No.: 16/361,163

(22) Filed: Mar. 21, 2019

(65) Prior Publication Data
US 2019/0219641 A1    Jul. 18, 2019

Related U.S. Application Data

(63) Continuation of application No. PCT/JP2017/034595, filed on Sep. 25, 2017.

(30) Foreign Application Priority Data

Sep. 23, 2016    (JP) .............................. JP2016-186329

(51) Int. Cl.
*H02J 7/00*    (2006.01)
*G01R 31/3842*    (2019.01)
(Continued)

(52) U.S. Cl.
CPC .......... *G01R 31/3842* (2019.01); *B60R 16/04* (2013.01); *G01R 31/36* (2013.01);
(Continued)

(58) Field of Classification Search
CPC .............. G01R 31/3842; G01R 31/389; G01R 31/388; G01R 31/367; G01R 31/36;
(Continued)

(56) References Cited

U.S. PATENT DOCUMENTS 6,801,016 B2 * 10/2004 Davis .................. H01M 10/441
                                                              320/132
8,198,863 B1    6/2012 Wortham
(Continued)

FOREIGN PATENT DOCUMENTS

EP    2 246 956 A1    11/2010
JP    S53-127618 A    11/1978
(Continued)

OTHER PUBLICATIONS

International Search Report (ISR) issued in PCT/JP2017/034595 dated Nov. 2017.
(Continued)

*Primary Examiner* — Arun C Williams
(74) *Attorney, Agent, or Firm* — Chen Yoshimura LLP (57)    ABSTRACT

A secondary battery state detection device for detecting the state of a secondary battery includes at least one processor and at least one memory that is communicably connected to the at least one processor. The at least one processor reads a set of instructions stored in the at least one memory, and executes detection processing in which a charging voltage is detected, the charging voltage being generated when an alternator that generates an adjustable voltage charges the secondary battery; computation processing in which a charging resistance is computed as an internal resistance of the secondary battery when the alternator charges the secondary battery; and estimation processing in which a state of charge of the secondary battery is estimated on the basis of the charging voltage detected by the detection processing and on
(Continued)

the charging resistance computed by the computation processing.

10 Claims, 6 Drawing Sheets

(51) Int. Cl.
*G01R 31/388* (2019.01)
*G01R 31/389* (2019.01)
*H01M 10/42* (2006.01)
*G01R 31/367* (2019.01)
*H01M 10/48* (2006.01)
*H02J 7/14* (2006.01)
*B60R 16/04* (2006.01)
*G01R 31/36* (2020.01)

(52) U.S. Cl.
CPC ......... *G01R 31/367* (2019.01); *G01R 31/388* (2019.01); *G01R 31/389* (2019.01); *H01M 10/425* (2013.01); *H01M 10/48* (2013.01); *H02J 7/00* (2013.01); *H02J 7/007* (2013.01); *H02J 7/14* (2013.01); *H01M 2010/4278* (2013.01); *H01M 2220/20* (2013.01)

(58) Field of Classification Search
CPC ..... B60R 16/04; H01M 10/425; H01M 10/48; H01M 2010/4278; H01M 2220/20; H02J 7/00; H02J 7/007; H02J 7/14
See application file for complete search history.

(56) References Cited

U.S. PATENT DOCUMENTS

| | | | |
|---|---|---|---|
| 2008/0215266 A1* | 9/2008 | Mizuno | G01R 31/389 |
| | | | 702/63 |
| 2012/0310563 A1* | 12/2012 | Shigemizu | G01R 31/3828 |
| | | | 702/63 |
| 2010/3154574 | 6/2013 | Nomoto | |
| 2013/0154577 A1 | 6/2013 | Iwane et al. | |
| 2015/0226811 A1 | 8/2015 | Shih et al. | |
| 2017/0269165 A1 | 9/2017 | Takashima et al. | |
| 2019/0094308 A1 | 3/2019 | Fukui | |

FOREIGN PATENT DOCUMENTS

| | | |
|---|---|---|
| JP | 2004-015963 A | 1/2004 |
| JP | 5307113 B2 | 10/2013 |
| JP | 2014-074588 A | 4/2014 |
| JP | 5863658 B2 | 2/2016 |
| JP | 2016-099123 A | 5/2016 |
| JP | 2016-109565 A | 6/2016 |
| WO | 2016/067586 A1 | 5/2016 |
| WO | 2016/080111 A1 | 5/2016 |
| WO | 2016/088895 A1 | 6/2016 |

OTHER PUBLICATIONS

Written Opinion (PCT/ISA/237) issued in PCT/JP2017/034595 dated Nov. 2017. (Concise Explanation of Relevance: This Written Opinion considers that the some of claims are described by or obvious over the Foreign Patent Document cited in the ISR.).
European Search Report dated Jun. 5, 2019 in a counterpart European patent application No. 17853215.6.

* cited by examiner

SECONDARY BATTERY STATE DETECTION DEVICE AND SECONDARY BATTERY STATE DETECTION METHOD

BACKGROUND OF THE INVENTION

Technical Field

The present invention relates to a secondary battery state detection device and a secondary battery state detection method.

Background Art

Technology for detecting that a secondary battery has reached a fully charged state includes, for example, that disclosed in Patent Documents 1 to 3.

Patent Document 1 discloses technology in which voltage values and current values are plotted on a current-voltage plane, and according to the positions of points that have been plotted on the current-voltage plane, a determination is made as to whether or not a secondary battery has reached a charge acceptance limit.

Patent Document 2 discloses technology in which a reaction resistance in a reaction to charge a secondary battery is found based on a current-voltage relationship during charging, and a full charge of the secondary battery is detected based on an increase in the reaction resistance.

Patent Document 3 discloses technology for detecting a full charge, and for computing an SOC while detecting a full charge, based on the difference (ΔV) between a voltage during charging and an open-circuit voltage (OCV) and based on separately found internal resistances (Rohm, Rct1, . . . ) during discharge.

RELATED ART DOCUMENTS

Patent Documents

Patent Document 1: Japanese Patent Publication No. 5863658
Patent Document 2: Japanese Patent Publication No. 5307113
Patent Document 3: Japanese Patent Application Laid-Open Publication No. 2016-109565

SUMMARY OF THE INVENTION

In order to reduce fuel consumption, in recent years technology in which a charging voltage supplied from an alternator is changed in steps so as to not wastefully charge a secondary battery has come into widespread use. Thus, with the aforementioned conventional technologies, which assume that voltage will not change, when the generated voltage by the alternator varies, it is not possible to accurately detect an accurate state of charge or a full charge of the secondary battery.

The present invention was made in light of the foregoing and aims to provide a secondary battery state detection device and a secondary battery state detection method with which it is possible to accurately detect the state of charge or a full charge of a secondary battery even when the generated voltage by an alternator changes.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a device for detecting a state of charge of a rechargeable battery that is charged by an alternator outputting an adjustable charging voltage, including: one or more programmable processors to be connected to a voltage detector detecting a charging voltage of the rechargeable battery and to a current detector detecting a charging current of the rechargeable battery, the one or more processors being programmed to perform the following: calculating a charging resistance parameter that represents at least partially an internal resistance of the rechargeable battery while the rechargeable battery is being charged, using at least the detected charging voltage and the detected charging current; estimating the state of charge of the rechargeable battery in accordance with the detected charging voltage and the calculated charging resistance parameter by referring to a prescribed relationship between at least select levels of the state of charge and corresponding values of the charging resistance parameter that depends on a magnitude of the charging voltage; and outputting data representing the estimated state of charge.

With this configuration, it is possible to accurately detect the state of charge such as a full charge of the secondary battery even when the generated voltage by the alternator changes.

In estimating the state of charge, the one or more programmable processors may determine whether the calculated charging resistance parameter is greater than or equal to a predetermined threshold that is set to be dependent on the magnitude of the charging voltage, and if the calculated charging resistance parameter is greater than or equal to the predetermined threshold, the one or more programmable processors may determine that the rechargeable battery is charged in full or to a prescribed state of charge. Moreover, the predetermined threshold may be set smaller as the magnitude of the charging voltage increases.

In estimating the state of charge, the one or more programmable processors may determine whether the calculated charging resistance parameter is greater than or equal to a predetermined threshold that is set to a fixed value regardless of the magnitude of the charging voltage, and if the calculated charging resistance parameter is greater than or equal to the predetermined threshold, the one or more programmable processors may determine that the rechargeable battery is charged to a prescribed state of charge that depends on the magnitude of the charging voltage, and the prescribed state of charge may be set greater as the detected magnitude of the charging voltage increases.

In estimating the state of charge, the one or more programmable processors may determine whether the calculated charging resistance parameter is greater than or equal to a predetermined threshold that is set to be dependent on the magnitude of the charging voltage, and if the calculated charging resistance parameter is greater than or equal to the predetermined threshold, the one or more programmable processors may determine that the rechargeable battery is charged a prescribed state of charge that depends on the magnitude of the charging voltage. Moreover, the prescribed state of charge may be set greater as the detected magnitude of the charging voltage increases, and the predetermined threshold may be set smaller as the magnitude of the charging voltage increases.

In calculating the charging resistance parameter, the one or more programmable processors may divide a differential between the detected charging voltage and an open-circuit voltage of the rechargeable battery by the detected charging current.

With this configuration, the charging resistance parameter that can be easily determined can be used.

In calculating the charging resistance parameter, the one or more programmable processors may apply an equivalent circuit model for the rechargeable battery and may determine circuit parameters of the equivalent circuit model on the basis of the detected charging voltage and the detected charging current, and the one or more programmable processors may use a determined resistance value of one or more of resistance elements in the equivalent circuit model as the charging resistance parameter.

Thus, an equivalent circuit model may be used to find the charging resistance parameter that represents (at least partially) the internal resistance during charging.

In calculating the charging resistance parameter, the one or more programmable processors may divide a differential between the detected charging voltage and an open-circuit voltage of the rechargeable battery by the detected charging current, and the one or more processors may apply an equivalent circuit model for the rechargeable battery and may determine circuit parameters of the equivalent circuit model based on voltage and current during discharge of the rechargeable battery, and the one or more processors may determine the state of charge of the rechargeable battery based on a ratio of a determined resistance of a resistance element in the equivalent circuit model to the charging resistance parameter by referring to a prescribed correlation between the ratio and values of the state of charge.

The above-mentioned prescribed relationship between the at least select levels of the state of charge and corresponding values of the charging resistance parameter may be provided in the form of a database stored in a memory, setting forth the prescribed relationship, and the one or more processors may access the memory in order to refer to the prescribed relationship.

Alternatively or in addition, the above-mentioned prescribed relationship between the at least select levels of the state of charge and corresponding values of the charging resistance parameter may be provided in the form of a prescribed mathematical function that takes at least the charging resistance parameter and the charging voltage as input and outputs a corresponding value of the state of charge.

In another aspect, the present disclosure provides a battery state sensor, including: the device for detecting the state of the rechargeable battery as set forth above; the voltage detector connected to the one or more programmable processors; and the current detector connected to the one or more programmable processors.

In another aspect, the present disclosure provides a method for detecting a state of charge of a rechargeable that is charged by an alternator outputting an adjustable charging voltage, executed by one or more programmable processors connected to a voltage detector detecting a charging voltage of the rechargeable battery and to a current detector detecting a charging current of the rechargeable battery, the method including: calculating a charging resistance parameter that represents at least partially an internal resistance of the rechargeable battery while the rechargeable battery is being charged, using at least the detected charging voltage and the detected charging current; estimating the state of charge of the rechargeable battery in accordance with the detected charging voltage and the calculated charging resistance parameter by referring to a prescribed relationship between at least select levels of the state of charge and corresponding values of the charging resistance parameter that depends on a magnitude of the charging voltage; and outputting data representing the estimated state of charge.

It is to be understood that both the foregoing general description and the following detailed description are exemplary and explanatory, and are intended to provide further explanation of the invention as claimed.

DETAILED DESCRIPTION OF EMBODIMENTS

Next, embodiments of the present invention will be described.

(A) Configuration of Embodiment 1 of the Present Invention

Figure 1:
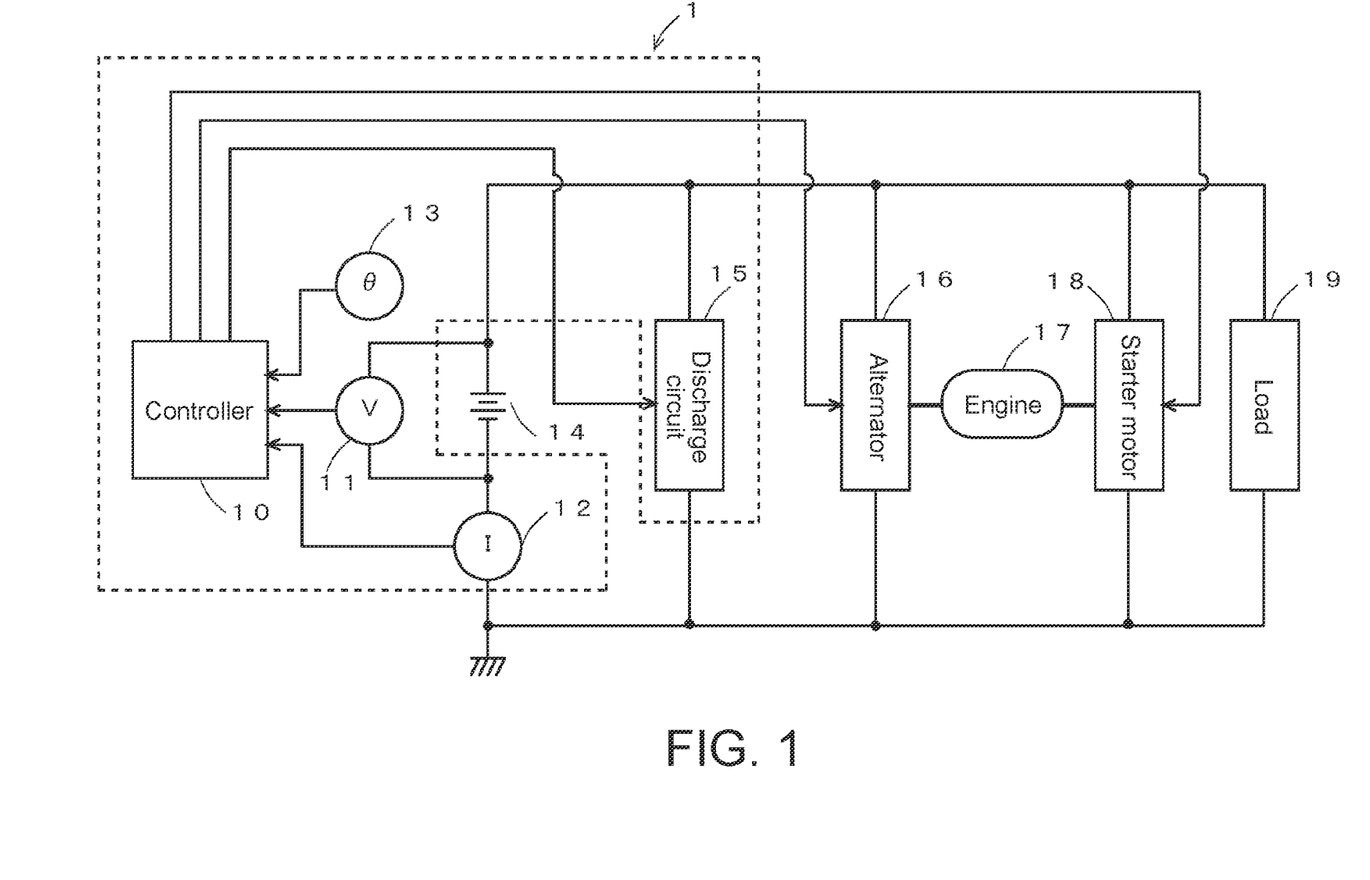
FIG. 1 is a diagram illustrating an example of configuration for a secondary battery state detection device according to Embodiment 1 of the present invention.

FIG. 1 is a diagram illustrating the electrical system of a vehicle provided with a secondary battery state detection device according to Embodiment 1 of the present invention. In this figure, the main configuration elements of a secondary battery state detection device 1 are configured by a controller 10, a voltage sensor 11, a current sensor 12, a temperature sensor 13, and a discharge circuit 15. The secondary battery state detection device 1 controls the charging state of a secondary battery 14. Here, the controller 10 detects the state of the secondary battery 14 by referencing outputs from the voltage sensor 11, the current sensor 12, and the temperature sensor 13, and controls the charging state of the secondary battery 14 by controlling a generated voltage by an alternator 16. The voltage sensor 11 detects the terminal voltage of the secondary battery 14 and reports this voltage to the controller 10. The current sensor 12 detects the current flowing through the secondary battery 14 and reports this current to the controller 10. The temperature sensor 13 detects the temperature of an electrolyte of the secondary battery 14 or the ambient temperature around the secondary battery 14 and reports this temperature to the controller 10.

The discharge circuit 15 is, for example, configured by series-connected semiconductor switches, resistor elements, and the like. The semiconductor switches are controlled to be switched ON/OFF by the controller 10, whereby the discharge circuit 15 discharges the secondary battery 14 in accordance with an instruction from the secondary battery state detection device 1.

The secondary battery 14 is configured by a secondary battery that includes an electrolyte, such as a lead-acid battery, a nickel-cadmium battery, or a nickel-metal hydride battery. The secondary battery 14 is charged by the alternator 16, and in addition to driving a starter motor 18 to start an engine, the secondary battery 14 supplies power to a load 19. The alternator 16 is driven by an engine 17 so as to generate AC power. The alternator 16 converts this AC power to DC power using a rectifier circuit and charges the secondary battery 14 therewith. The alternator 16 is controlled by the controller 10 such that the voltage it generates is adjustable.

The engine 17 is, for example, configured by a reciprocating engine or a rotary engine such as a gasoline engine or a diesel engine. The engine 17 is started by the starter motor 18 so as to drive a drive wheel via a transmission and give propulsion to the vehicle, as well as drives the alternator 16 so as to generate power. The starter motor 18 is, for example, configured by a DC motor. The starter motor 18 generates torque using power supplied from the secondary battery 14 to start the engine 17. The load 19 is, for example, configured by an electric steering motor, a defogger, a seat heater, an ignition coil, a car audio system, a car navigation system, and the like. The load 19 operates using power from the secondary battery 14.

Figure 2:
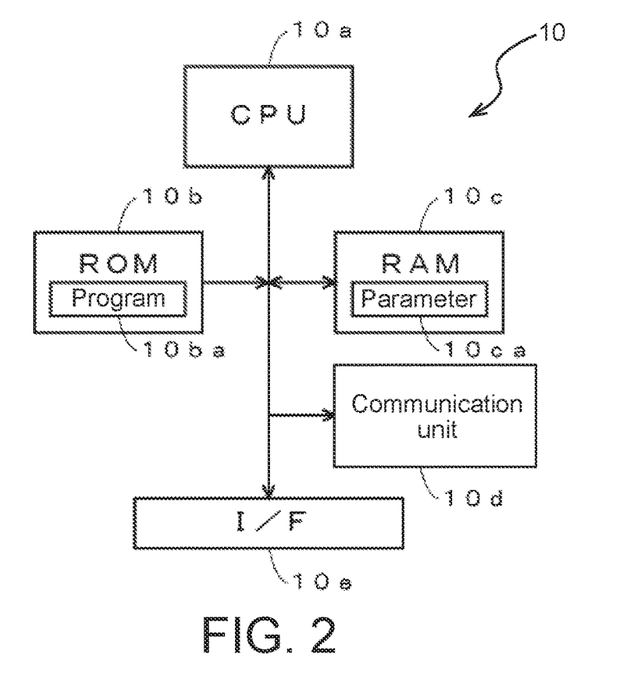
FIG. 2 is a block diagram illustrating a detailed example of configuration for a controller in FIG. 1.

FIG. 2 is a diagram illustrating a detailed example of configuration for the controller 10 illustrated in FIG. 1. As illustrated in this figure, the controller 10 is, for example, a single-chip microcontroller, and includes a central processing unit (CPU) 10a, read-only memory (ROM) 10b, random access memory (RAM) 10c, a communication unit 10d, and an interface (I/F) 10e. Here, the CPU 10a controls various sections on the basis of a program 10ba stored in the ROM 10b. The ROM 10b is configured by semiconductor memory or the like, and stores the program 10ba and the like. The RAM 10c is configured by semiconductor memory or the like. The RAM 10c stores data that is generated when the program 10ba is executed, and parameters 10ca such as for equations or tables, described below. The communication unit 10d communicates with a higher-order device such as electronic control unit (ECU), and reports detected information or control information to the higher-order device. The I/F 10e digitizes and takes-in signals supplied from the voltage sensor 11, the current sensor 12, and the temperature sensor 13, and supplies drive current to the discharge circuit 15, the alternator 16, the starter motor 18, and so on to control these components. Note that although the example of FIG. 2 includes one each of the CPU 10a, the ROM 10b, and the RAM 10c, a plurality of these components may be provided. A digital signal processor (DSP) may also be employed in place of the CPU 10a.

(B) Operation of Embodiment 1 of the Present Invention

Next, the operation of Embodiment 1 of the present invention will be described. Note that in the following, the principals of operation of the embodiment of the present invention will first be described, followed by a detailed description of the operation thereof.

Figure 3:
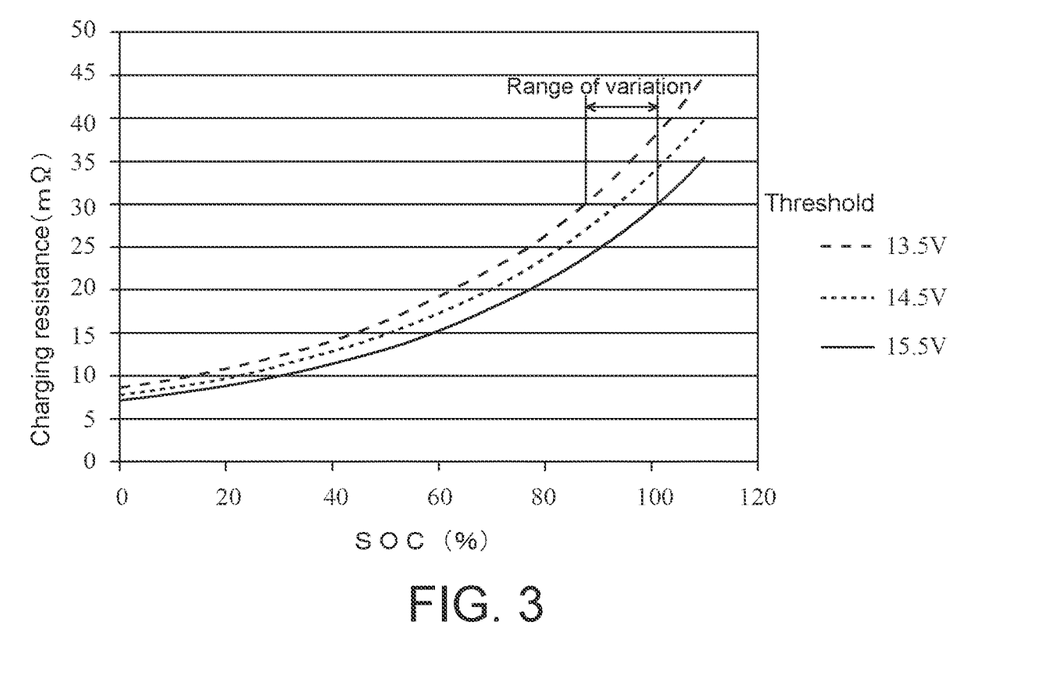
FIG. 3 is a diagram for explaining the operation of a conventional secondary battery state detection device.

First, the principals of operation of Embodiment 1 will be described. FIG. 3 is a diagram illustrating relationships between the state of charge (SOC) and the charging resistance for the secondary battery 14 when the secondary battery 14 is charged by the alternator 16 with various voltages. Note that in this figure, the solid curve represents the relationship between SOC and the charging resistance for the secondary battery 14 when the charging is performed at 15.5 V, the curve with short dashes represents the relationship between SOC and charging resistance when the charging is performed at 14.5 V, and the curve with long dashes represents the relationship between SOC and charging resistance when the charging is performed at 13.5 V. Here, the charging resistance refers to an electrical resistance within the secondary battery 14 when the secondary battery 14 is being charged by the alternator 16. More specifically, the "charging resistance" in this disclosure means a charging resistance parameter representing (at least partially) an internal resistance of the secondary battery 14 as seen from the exterior when it is charged. For example, the charging resistance (i.e., the charging resistance parameter) may be a resistance $R(=(V-OCV)/I)$ that is determined by a voltage V and a current I applied to the secondary battery 14 when the secondary battery 14 is being charged and by an open-circuit voltage OCV. As described below, the charging resistance parameter (also referred to as the charging resistance in this disclosure) may also be any other parameter as long as it represents (at least partially) an internal resistance of the secondary battery 14 while it is charged.

In FIG. 3, with the charging voltage of 15.5 V, when the charging resistance is greater than or equal to approximately 30 mΩ, a determination can be made that the secondary battery 14 is fully charged (SOC=100%). In other words, a determination can be made as to whether or not the secondary battery 14 is fully charged by comparing the magnitude of the charging resistance with a 30 mΩ threshold. However, when the charging voltage is 14.5 V or 13.5 V, the SOC is below 100% when the charging resistance is 30 mΩ. Consequently, if the same threshold is used for determining the full charge when the generated voltage by the alternator 16 is not fixed, but varies, it will not be possible to make an accurate determination.

Figure 4:
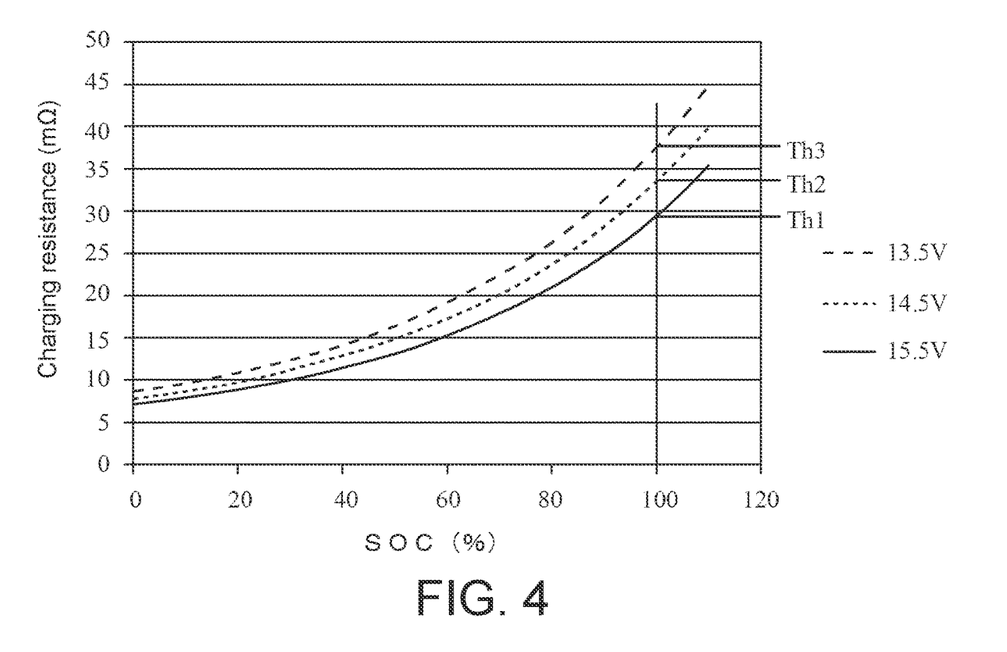
FIG. 4 is a diagram for explaining the operation of Embodiment 1.

Accordingly, as illustrated in FIG. 4, by employing a threshold that varies according to the generated voltage by the alternator 16 (=charging voltage) in Embodiment 1 of the present invention, it is possible to detect a full charge of the secondary battery 14 even when the generated voltage is changed. For example, in the example of FIG. 4, a threshold Th1 is employed to make a determination when the generated voltage by the alternator 16 is 15.5 V, a threshold Th2 is employed to make a determination when the generated voltage is 14.5 V, and a threshold Th3 is employed to make a determination when the generated voltage is 13.5 V. In such way, it is possible to accurately detect that the secondary battery 14 has reached a fully charged state even when the generated voltage by the alternator 16 is changed.

Although in FIG. 4, a full charge (a 100% state of charge) is detected, a predetermined state of charge (for example, a 95% state of charge) may be detected instead. Furthermore, although in the example of FIG. 4, a threshold Th1 to Th3 is defined for each charging voltage, as described below with reference to FIG. 5, a threshold Th serving as a baseline may be corrected to Th' according to the charging voltage, and this threshold Th' is employed to make a determination.

Figure 5:
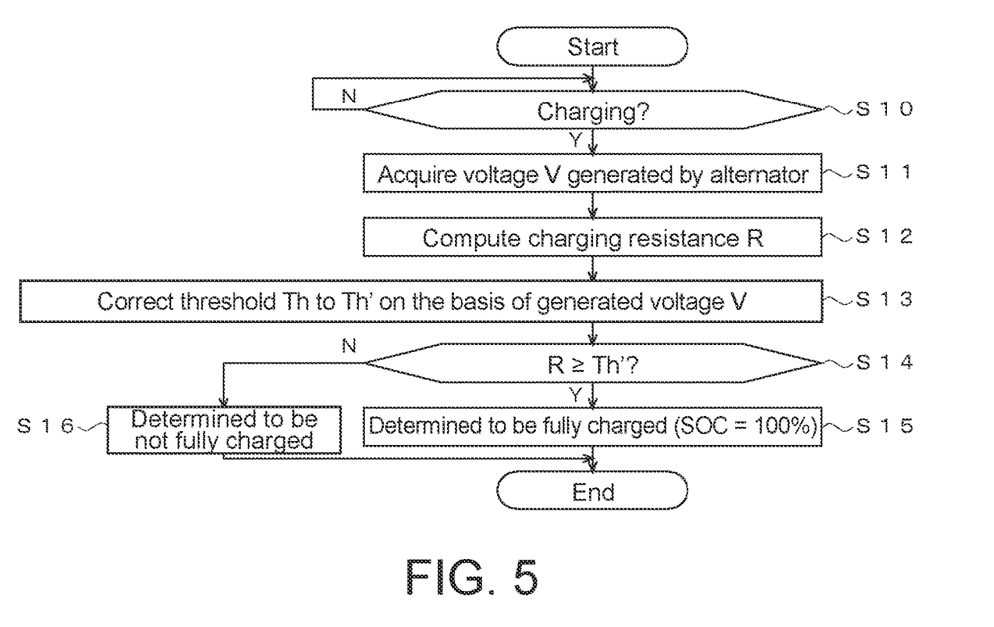
FIG. 5 is a flowchart for explaining the operation of Embodiment 1.

Next, an example of processing executed in Embodiment 1 will be described with reference to FIG. 5. Upon initiating the processing in the flowchart illustrated in FIG. 5, the following steps are executed.

At step S10, the controller 10 references output from the current sensor 12 and determines whether or not the secondary battery 14 is being charged by the alternator 16. When the controller 10 determines that the secondary battery 14 is being charged (step S10: Y), the controller 10 proceeds to step S11, otherwise (step S10: N) the same process is repeated. Alternatively, when the controller 10 determines that the secondary battery 14 is not being charged, rather than repeating the same process, the controller 10 may terminate the process.

At step S11, the controller 10 references output from the voltage sensor 11 and acquires the generated voltage V by the alternator 16. This results, for example, in a voltage of 15.5 V or the like being acquired.

At step S12, the controller 10 computes a charging resistance R. More specifically, the charging resistance R can be found using the equation R=(V−OCV)/I, which employs the current I acquired at step S10, the generated voltage V acquired at step S11, and an open-circuit voltage OCV obtained by, for example, measuring the voltage of the secondary battery 14 after the vehicle has been stopped for a given amount of time.

At step S13, the controller 10 corrects the threshold Th for determining whether or not the secondary battery 14 is fully charged to Th' on the basis of the generated voltage V acquired at step S11. More specifically, the threshold Th is corrected using the equation Th'=Th×g(V), whereby the threshold Th serving as the baseline is multiplied by g(V). Note that g(V) is a function that increases in value as the value of the generated voltage V decreases. In the example of FIG. 4, if the threshold Th1 for the generated voltage V=15.5 V is taken as the baseline threshold Th, g(V) is set such that Th'=Th1×g(V)=Th2 for the generated voltage V=14.5 V, and such that Th'=Th1×g(V)=Th3 for the generated voltage V=13.5 V.

Although in the above example, only the generated voltage V is taken into account, the temperature of the secondary battery 14 detected by the temperature sensor 13, for example, may be additionally taken into account to correct the threshold Th. Specifically, correction may be performed using the equation Th'=Th×g(V,θ), which employs a function g(V,θ) that takes both the generated voltage V and a temperature θ as variables.

At step S14, the controller 10 compares the charging resistance R computed at step S12 with the corrected threshold Th' obtained at step S13. When R≥Th' is satisfied (step S14: Y), processing proceeds to step S15, otherwise (step S14: N) processing proceeds to step S16.

At step S15, the controller 10 determines that the secondary battery 14 has been fully charged (SOC=100%). Consequently, the controller 10 is able to reduce the load on the engine 17 and improve fuel efficiency by stopping the engine 17 from driving the alternator 16.

At step S16, the controller 10 determines that the secondary battery 14 has not to be fully charged. Consequently, the controller 10 continues charging until the secondary battery 14 is fully charged by continuing to drive the alternator 16 with the engine 17.

With the above operation, the threshold Th serving as the baseline is corrected according to the generated voltage by the alternator 16, enabling a determination to be made regarding a fully charged state on the basis of the corrected threshold Th'. This makes it possible for a fully charged state to be accurately determined even when the generated voltage varies.

(C) Configuration of Embodiment 2 of the Present Invention

Next, Embodiment 2 of the present invention will be described. The configuration of Embodiment 2 of the present invention is the same as that of Embodiment 1, but the processes performed by the controller 10 differ. Thus, the description of the configuration will be omitted.

(D) Operation of Embodiment 2 of the Present Invention

Figure 6:
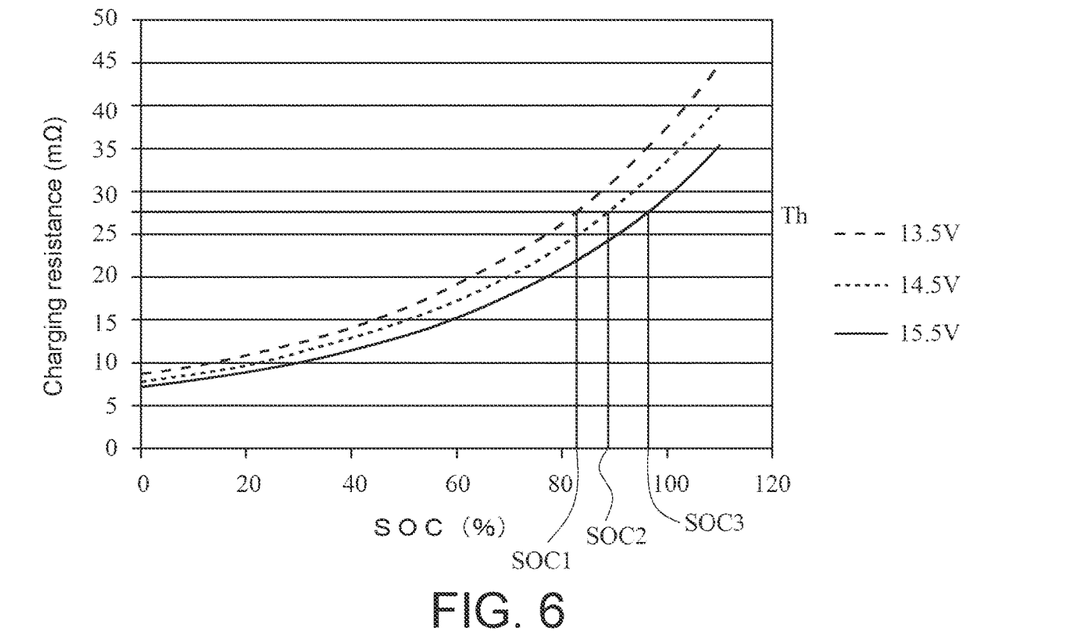
FIG. 6 is a diagram for explaining the operation of Embodiment 2.

The operation of Embodiment 2 of the present invention will be described with reference to FIG. 6. In Embodiment 2, a threshold Th having a fixed value, such as that illustrated in FIG. 6, is employed. When the charging resistance (i.e., the charging resistance parameter) becomes greater than or equal to the threshold Th, the state of charge is determined to be SOC1 if the charging voltage was 13.5 V. When the charging resistance is greater than or equal to the threshold Th, the state of charge is determined to be SOC2 if the charging voltage was 14.5 V. Furthermore, when the charging resistance becomes greater than or equal to the threshold Th, the state of charge is determined to be SOC3 if the charging voltage was 15.5 V. Note that it is preferable to set a threshold Th such that the state of charge would be less than or equal to 100% if charging is performed with the largest voltage the alternator 16 can supply. For example, if the largest generated voltage is 15.5 V, it is preferable that Th be set such that SOC3≤100%. Setting the threshold Th in this manner can prevent continued charging beyond a SOC of 100% even when the generated voltage by the alternator 16 changes. Although in the above description, SOC1 to SOC3 are selected according to the charging voltage, as described below, alternatively, an SOC may be set as a baseline (baseline SOC), and this baseline SOC may be corrected according to the charging voltage.

Figure 7:
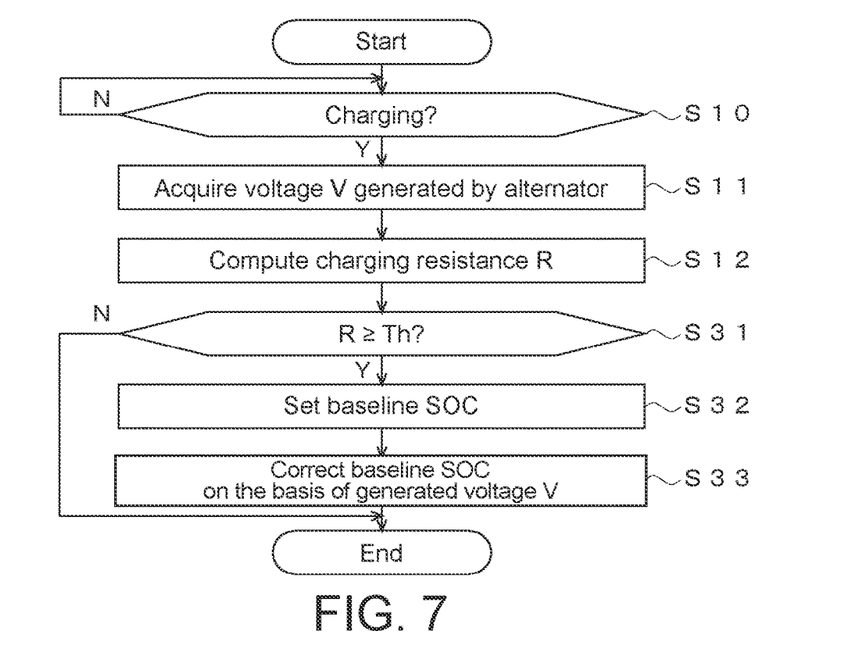
FIG. 7 is a flowchart for explaining the operation of Embodiment 2.

Next, the operation of Embodiment 2 of the present invention will be described in detail, with reference to FIG. 7. Upon initiating the processing in the flowchart illustrated in FIG. 7, the following steps are executed. Note that in FIG. 7, the same reference characters will be given to elements corresponding to those in FIG. 5, and description thereof will be omitted. In comparison to FIG. 5, FIG. 7 lacks the processing of step S13 to step S16, and additionally includes the processing of step S31 to step S33, and so the following description will focus on the processing of step S31 to step S33.

At step S31, the controller 10 compares the charging resistance R computed at step S12 with the threshold Th and determines whether or not R≥Th is satisfied. If R≤Th is determined to be satisfied (step S31: Y), the controller 10 proceeds to step S32. Otherwise (step S31: N), the controller 10 ends the process. For example, the controller 10 compares the threshold Th illustrated in FIG. 6 with the charging resistance R and if the controller 10 determines that R≥Th is satisfied, the controller 10 proceeds to step S32.

At step S32, the controller 10 sets a baseline SOC. More specifically, the controller 10, for example, sets the SOC3 illustrated in FIG. 6 as the baseline SOC. Another SOC may, of course, be set as the baseline SOC.

At step S33, the controller 10 corrects the baseline SOC set at step S32 according to the generated voltage V acquired at step S11. More specifically, for example, the baseline SOC is corrected using the equation SOC'=SOC×h(V), whereby the baseline SOC is multiplied by h(V). Note that h(V) is a function that decreases in value as the value of the generated voltage V decreases. In the example of FIG. 6, if SOC3 is set as the baseline SOC, SOC3 being for cases in which the generated voltage V=15.5 V, h(V) is set such that SOC'=SOC3×h(V)=SOC2 when the generated voltage V=14.5 V, and such that SOC'=SOC3×h(V)=SOC1 when the generated voltage V=13.5 V.

Here, although in the above example, only the generated voltage V is taken into account, the temperature of the secondary battery 14 detected by the temperature sensor 13 may also be taken into account to correct the baseline SOC. Specifically, the correction may be performed using the equation SOC'=SOC×h(V,θ), which employs a function h(V,θ) that takes both the generated voltage V and a temperature θ as variables.

As described above, in Embodiment 2 of the present invention, the baseline SOC is corrected according to the generated voltage of the alternator 16. This makes it possible to accurately find the SOC for controlling charging even when the generated voltage fluctuates.

(E) Modified Embodiments

Figure 8:
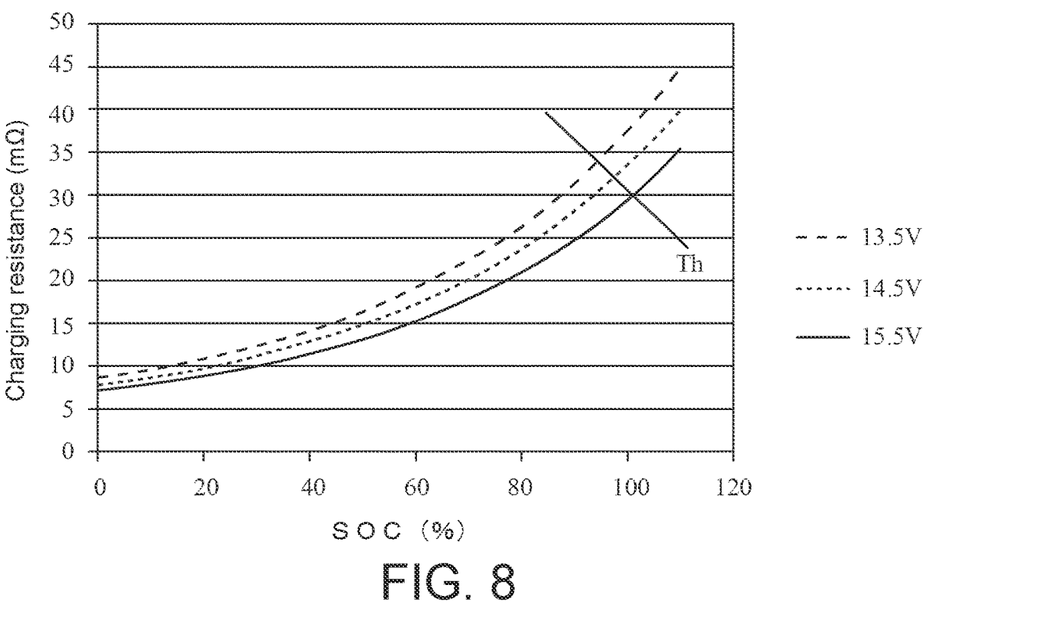
FIG. 8 is a diagram for explaining the operation of a Modified Embodiment.

The above embodiments are merely exemplary, and it goes without saying that the present invention is not limited to cases such as those described above. For example, although in each of the above embodiments a threshold that is perpendicular or parallel to the X-axis (horizontal axis) is employed to make a determination, as illustrated in FIG. 8, for example, a threshold Th that is sloped with respect to the X-axis may be employed therefor. In other words, a Th(V) that is a function of the generated voltage may be employed rather than a Th having a fixed value, and a full charge may be determined by comparing this Th(V) with the charging resistance parameter R. With this configuration, charging can be terminated at a state of charge that is optimal for each generated voltage, thereby, for example, making it possible to prevent large variations in charging time that would depend on the generated voltage. Here, a function Th(V,θ) that is a function of not only the generated voltage, but also the temperature θ of the secondary battery 14 detected by the temperature sensor 13 may be employed together with the charging resistance R in making this judgement. Furthermore, although in the example of FIG. 8, the threshold Th is a straight line, a curved threshold Th may be employed to make a determination.

In each of the above embodiments, no mention was made of cases in which the generated voltage changes after a determination has been made. Nonetheless, in Embodiment 1, if the charging voltage is changed to 13.5 V after it had been determined that the charging resistance satisfies R≥Th1 with the charging voltage of 15.5 V, a second determination may be made in order to confirm whether the charging resistance satisfies R≥Th3, for example. This method enables the determination of the full charge with better accuracy. Furthermore, in Embodiment 2 and Modified Embodiment above, if the generated voltage is changed to 15.5 V after it had been determined that R≥Th when the generated voltage was 13.5 V, charging may continue until R≥Th once more holds.

Figure 9A:
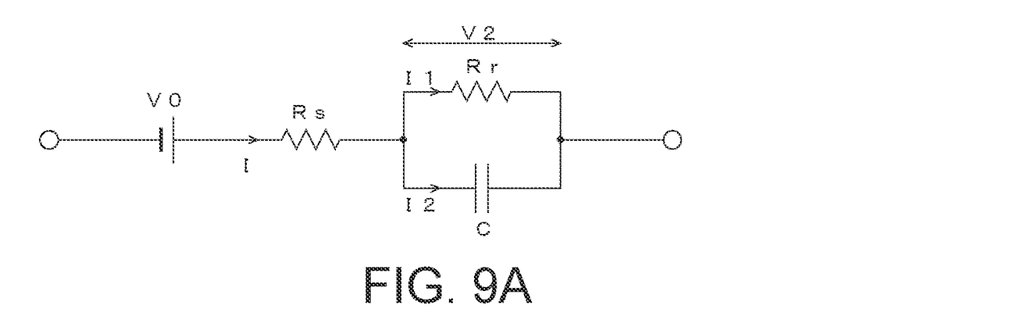
FIGS. 9A and 9B respectively show diagrams for explaining Modified Embodiments.
Figure 9B:
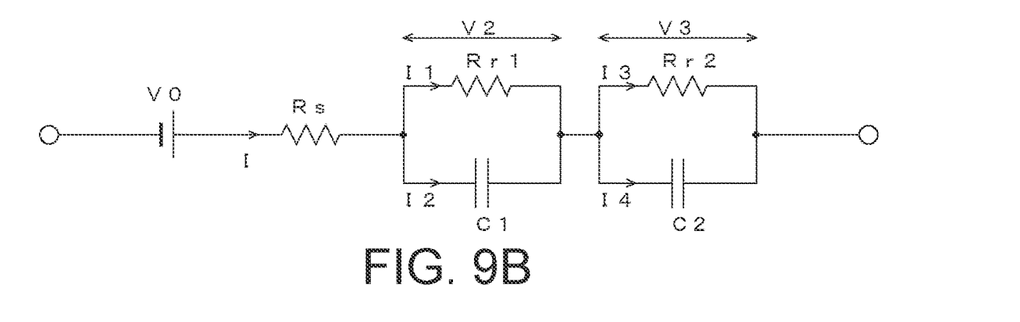

Furthermore, although in each of the above embodiments, the charging resistance parameter R is determined based on a current I, a voltage V, and an open-circuit voltage OCV of the secondary battery 14, alternatively, an equivalent circuit model for the secondary battery 14 such as illustrated in FIG. 9A or FIG. 9B may be obtained using learning processing, and a charging resistance parameter R that is obtained on the basis of the learned equivalent circuit may be used. For example, in FIG. 9A, the main configuration elements of an equivalent circuit model are a voltage source V0, a solution resistance Rs, a reaction resistance Rr, and a capacitor C. Here, the solution resistance Rs represents an internal resistance primarily composed of the solution resistance of the electrolyte of the secondary battery 14 and the conduction resistance of the electrodes of the secondary battery 14. A parallel circuit formed by the reaction resistance Rr and the capacitor C is an equivalent circuit corresponding to the positive pole of the secondary battery 14 and to the electrolyte in contact therewith. The voltage source V0 is an ideal voltage source with an internal impedance of 0.

Figure 10:
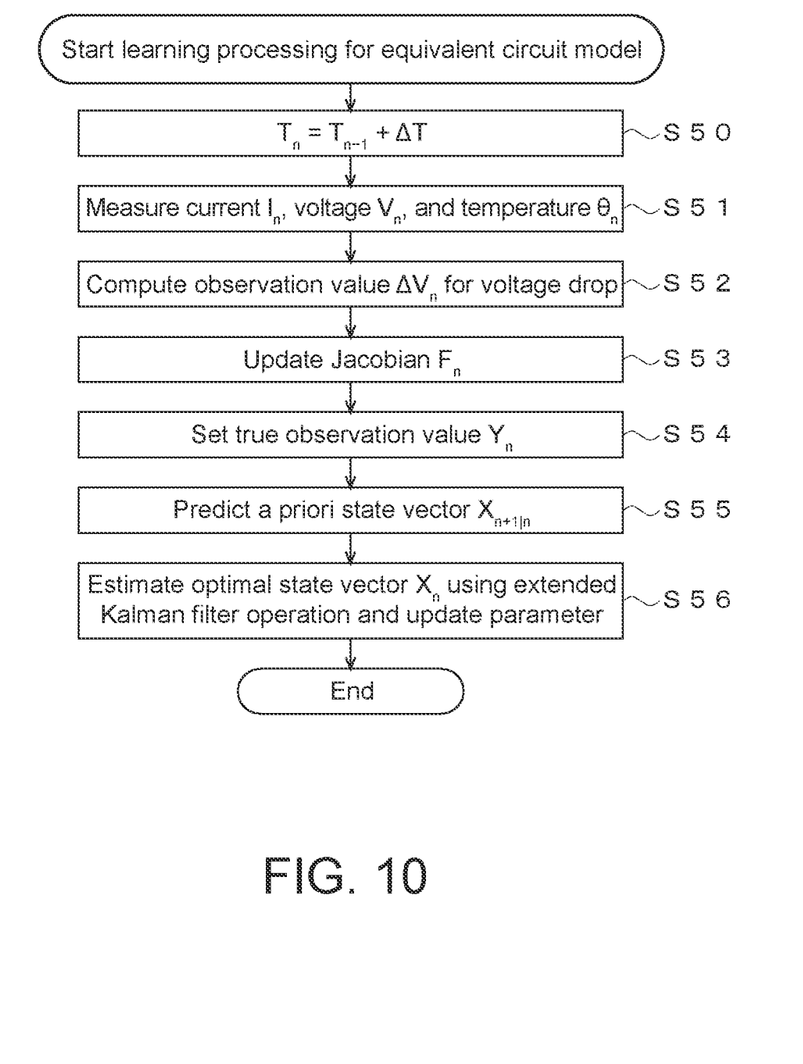
FIG. 10 is a flowchart for explaining the operation of the Modified Embodiment shown in FIG. 9A.

FIG. 10 is a diagram for explaining the learning processing for the equivalent circuit model illustrated in FIG. 9A. Upon initiating the processing in FIG. 10, the following steps are executed.

At step S50, the controller 10 assigns a value to a variable $T_n$, which represents time. This value is assigned by adding ΔT to a previous value $T_{n-1}$. Note that, for example, a value of several msecs to several hundred msecs can be employed for ΔT.

At step S51, the controller 10 measures a current $I_n$, a voltage $V_n$, and a temperature $θ_n$ on the basis of detection signals from the voltage sensor 11, the current sensor 12, and the temperature sensor 13.

At step S52, the controller 10 applies the voltage $V_n$ measured at step S51 to Equation (1) below and computes a voltage drop $ΔV_n$.

$$ΔV_n = V_n - OCV \quad (1)$$

Here, OCV is an open-circuit voltage. Methods for finding the OCV include, for example, setting the OCV to a terminal voltage of the secondary battery 14 measured just prior to start-up, or to an open-circuit voltage of the secondary battery 14 estimated based on the charge/discharge state of the secondary battery 14.

At step S53, the controller 10 updates a Jacobian $F_n$ on the basis of Equation (2) below, using an nth observation value and a previously estimated value of a state vector. Note that diag( ) signifies a diagonal matrix.

$$F_n = \text{diag}(1 - ΔT/Rr_n \cdot C_n, 1, 1, 1, 1) \quad (2)$$

At step S54, the controller 10 takes the $ΔV_n$ obtained by calculation at step S52 to be an actual observation value $Y_n$ for an extended Kalman filter, as expressed in Equation (3) below.

$$Y_n = ΔV_n \quad (3)$$

At step S55, the controller 10 finds a state vector $X_{n+1|n}$ in the next time step on the basis of Equation (4) below.

$$X_{n+1|n} = F_n \cdot X_n + U_n \quad (4)$$

Here, $X_n$ and $U_n$ are expressed by Equation (5) and Equation (6) below. Note that T signifies a matrix transpose.

$$X_n^T = (ΔV2, Rs, Rr, C, V0) \quad (5)$$

$$U_n^T = (Δt \cdot I_n/C, 0, 0, 0, 0) \quad (6)$$

Note that by defining $H_n^T$ as in Equation (7) below, it is possible to define an observation equation and a predicted observation value $Y_{n+1|n}$ as in Equation (8) below.

$$H_n^T = (1, I_n, 0, 0, 0) \quad (7)$$

$$Y_n = H_n^T \cdot X_n \quad (8)$$

At step S56, on the basis of the predicted value $X_{n+1|n}$ at the next time step of the state vector, the actual observation value $Y_{n+1|n}$, and the predicted observation value $Y_{n+1|n}$, the controller 10 estimates an optimal state vector $X_n$ through extended Kalman filter operations utilizing Kalman gain calculations and filtering calculations for each time step, and then the controller 10 updates adjustment parameters (of the equivalent circuit model) to optimal values based on the estimated state vector $X_n$.

Then, in the equivalent circuit model found in this manner, the reaction resistance Rr, for example, can be used as the charging resistance parameter. Alternatively, the solution resistance Rs may be used in place of the reaction resistance Rr, or the average or the sum of the reaction resistance Rr and the solution resistance Rs may be used as the charging resistance parameter.

Furthermore, although in some of the above embodiments, the charging resistance parameter R is computed by dividing the difference between the charging voltage V and the open-circuit voltage OCV by the charging current I, the stratification St and the polarization PI of the secondary battery 14 may be additionally taken into account in defining the charging resistance parameter R that represents (at least partially) an internal resistance of the secondary battery 14 during the charging. In other words, the charging resistance parameter R that is defined on the basis of Equation (9) below may be used.

$$R=(V-OCV-S-P1)/I \quad (9)$$

Once the charge/discharge of the secondary battery 14 stops, the St and PI components gradually decrease. Such a time-dependent behavior of OCV+St+PI can be measured and fitted with an exponential function, for example. Then the fitted exponential function can be used to estimate the value of OCV+St+PI in using Equation (9) above.

Furthermore, although in some of the above embodiments, the secondary battery 14 is determined to be fully charged or to have reached a predetermined SOC when the charging resistance parameter is greater than or equal to a prescribed threshold(s), alternatively, the state of charge may be determined in a different way. Specifically, for example, a discharge resistance Rd (resistance resulting from the series connection of Rs and Rr) is obtained by pulse discharging the secondary battery 14 using the discharge circuit 15 and through the processing of FIG. 10 described above. Then the charging resistance parameter R that is obtained using the equation R=(V−OCV)/I described above or using Equation (9) is evaluated. Because there is a correlation between the SOC and a ratio of the charging resistance parameter R to the discharge resistance Rd, the SOC is obtained by referencing that known correlation based on this ratio.

Alternatively, the internal resistance parameter R, which represents at least partially an internal resistance of the secondary battery 14 while it is being charged, may be defined by applying, to Equation (9), an average charging voltage computed through averaging processing performed until just prior to the engine 17 stopping, an open-circuit voltage OCV that is computed by using an SOC (here, an SOC calculated by charge/discharge integration) based on an OCV-SOC correlation formula as initially learned or previously learned, a stratification St acquired just prior to the engine stopping, and a polarization PI, an average current value I computed through averaging processing performed until just prior to the engine stopping. Here, the internal resistance R can be considered to be made up by Rs (solution resistance, conductor resistance), Rr1 (reaction resistance of the negative electrode), and Rr2 (reaction resistance of the positive electrode) illustrated in FIG. 9B. Once the internal resistance parameter R, which has been defined above, has been obtained for the particular charging operation, the controller 10 calculates the state of charge SOC on the basis of Equation (10) below. With respect to Equation (10), in order to take into account the effect of temperature, an amplitude factor $f'(\theta)$ that takes temperature $\theta$ as a variable may be multiplied, and an offset value $f(\theta)$ may be added, for example. A temperature calibration can be achieved on the basis of these $f(\theta)$ and $f'(\theta)$. Furthermore, exp(R, Rs, Rr1, Rr2) is an exponential function that takes R, Rs, Rr1, and Rr2 as variables, and the damping coefficient within the parenthesis can, for example, be an internal resistance ratio expressed by a ratio of a reaction resistance component, obtained by subtracting Rs (conduction resistance and solution resistance) from the internal resistance R, to a total for Rr1 and Rr2 acquired in advance. Note that Rs, Rr1, Rr2, stratification St, and polarization P1 are preferably corrected using the detected temperature $\theta$ since the values thereof change under the influence of temperature. Furthermore, although Equation (10) is a first order exponential function, Equation (10) may be a higher order exponential function or as a logarithmic function.

$$SOC=f(\theta)\times\exp(R,Rs,Rr1,Rr2)+f'(\theta) \quad (10)$$

As described above, there are multiple ways to define the charging resistance parameter that is representative (at least partially) of an internal resistance of the secondary battery 14 while it is being charged. Once the particular definition is adopted for the charging resistance parameter, the relationship between at least certain select levels of the SOC (such as full charge, 80% charge) and the charging resistance parameter, which also depends on the charging voltage value, examples of which are shown in FIGS. 4, 6, and 8 above, may be obtained empirically and stored in a memory in the controller 1 as database, for example. And by referring to that relationship, given the value of the obtained charging resistance parameter, the state of charge (partially full, or completely full, etc.) can be determined. Alternatively, as described above, rather than referring to such a database, the SOC may be calculated based on a prescribed function that takes at least the charging resistance parameter and the charging voltage as input and outputs the corresponding value of the SOC. Thus, even when the voltage generated by the alternator for charging the secondary battery (i.e., the charging voltage) changes, a more accurate determination of the SOC of the secondary battery is possible.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:
1. A device for detecting a state of charge of a rechargeable battery that is charged by an alternator outputting an adjustable charging voltage, comprising:
 one or more programmable processors to be connected to a voltage detector detecting a charging voltage of the rechargeable battery and to a current detector detecting a charging current of the rechargeable battery, the one or more processors being programmed to perform the following:

calculating a charging resistance parameter that represents at least partially an internal resistance of the rechargeable battery while the rechargeable battery is being charged, using at least the detected charging voltage and the detected charging current;

estimating the state of charge of the rechargeable battery in accordance with the detected charging voltage and the calculated charging resistance parameter by referring to a prescribed relationship between at least select levels of the state of charge and corresponding values of the charging resistance parameter that depends on a magnitude of the charging voltage; and outputting data representing the estimated state of charge, wherein in estimating the state of charge, the one or more programmable processors determine whether the calculated charging resistance parameter is greater than or equal to a predetermined threshold, and if the calculated charging resistance parameter is greater than or equal to the predetermined threshold, the one or more programmable processors determine that the rechargeable battery is charged to a prescribed state of charge, and wherein at least one of the predetermined threshold and the prescribed state of charge is set to be dependent on the magnitude of the charging voltage.

2. The device according to claim 1, wherein in estimating the state of charge, the one or more programmable processors determine whether the calculated charging resistance parameter is greater than or equal to the predetermined threshold that is set to be dependent on the magnitude of the charging voltage, and if the calculated charging resistance parameter is greater than or equal to the predetermined threshold, the one or more programmable processors determine that the rechargeable battery is charged to the prescribed state of charge, and wherein the predetermined threshold is set smaller as the magnitude of the charging voltage increases.

3. The device according to claim 1, wherein in estimating the state of charge, the one or more programmable processors determine whether the calculated charging resistance parameter is greater than or equal to the predetermined threshold that is set to a fixed value regardless of the magnitude of the charging voltage, and if the calculated charging resistance parameter is greater than or equal to the predetermined threshold, the one or more programmable processors determine that the rechargeable battery is charged to the prescribed state of charge that depends on the magnitude of the charging voltage, and wherein the prescribed state of charge is set greater as the detected magnitude of the charging voltage increases.

4. The device according to claim 1, wherein in estimating the state of charge, the one or more programmable processors determine whether the calculated charging resistance parameter is greater than or equal to the predetermined threshold that is set to be dependent on the magnitude of the charging voltage, and if the calculated charging resistance parameter is greater than or equal to the predetermined threshold, the one or more programmable processors determine that the rechargeable battery is charged the prescribed state of charge that depends on the magnitude of the charging voltage, wherein the prescribed state of charge is set greater as the detected magnitude of the charging voltage increases, and wherein the predetermined threshold is set smaller as the magnitude of the charging voltage increases.

5. The device according to claim 1, wherein in calculating the charging resistance parameter, the one or more programmable processors divide a differential between the detected charging voltage and an open-circuit voltage of the rechargeable battery by the detected charging current.

6. A device for detecting a state of charge of a rechargeable battery that is charged by an alternator outputting an adjustable charging voltage, comprising:

one or more programmable processors to be connected to a voltage detector detecting a charging voltage of the rechargeable battery and to a current detector detecting a charging current of the rechargeable battery, the one or more processors being programmed to perform the following:

calculating a charging resistance parameter that represents at least partially an internal resistance of the rechargeable battery while the rechargeable battery is being charged, using at least the detected charging voltage and the detected charging current;

estimating the state of charge of the rechargeable battery in accordance with the detected charging voltage and the calculated charging resistance parameter by referring to a prescribed relationship between at least select levels of the state of charge and corresponding values of the charging resistance parameter that depends on a magnitude of the charging voltage; and outputting data representing the estimated state of charge, wherein in calculating the charging resistance parameter, the one or more programmable processors apply an equivalent circuit model for the rechargeable battery and determine circuit parameters of the equivalent circuit model on the basis of voltage and current during discharge of the rechargeable battery, and wherein the one or more programmable processors use a determined resistance value of one or more of resistance elements in the equivalent circuit model as the charging resistance parameter.

7. A device for detecting a state of charge of a rechargeable battery that is charged by an alternator outputting an adjustable charging voltage, comprising:

one or more programmable processors to be connected to a voltage detector detecting a charging voltage of the rechargeable battery and to a current detector detecting a charging current of the rechargeable battery, the one or more processors being programmed to perform the following:

calculating a charging resistance parameter that represents at least partially an internal resistance of the rechargeable battery while the rechargeable battery is being charged, using at least the detected charging voltage and the detected charging current;

estimating the state of charge of the rechargeable battery in accordance with the detected charging voltage and the calculated charging resistance parameter by referring to a prescribed relationship between at least select levels of the state of charge and corresponding values of the charging resistance parameter that depends on a magnitude of the charging voltage; and outputting data representing the estimated state of charge, wherein in calculating the charging resistance parameter, the one or more programmable processors divide a differential between the detected charging voltage and an open-circuit voltage of the rechargeable battery by the detected charging current, and wherein the one or more processors apply an equivalent circuit model for the rechargeable battery and determine circuit parameters of the equivalent circuit model based on voltage and current during discharge of the rechargeable battery, and wherein the one or more processors determine the state of charge of the rechargeable battery based on a ratio of a determined resistance of a resistance element in the equivalent circuit model to the charging resistance parameter by referring to a prescribed correlation between said ratio and values of the state of charge.

8. The device according to claim 1,
wherein the prescribed relationship between the at least select levels of the state of charge and corresponding values of the charging resistance parameter is provided in the form of a database stored in a memory, setting forth said prescribed relationship, and wherein the one or more processors access said memory in order to refer to the prescribed relationship.

9. The device according to claim 1, wherein the prescribed relationship between the at least select levels of the state of charge and corresponding values of the charging resistance parameter is provided in the form of a prescribed mathematical function that takes at least the charging resistance parameter and the charging voltage as input and outputs a corresponding value of the state of charge.

10. A battery state sensor, comprising:
the device for detecting the state of the rechargeable battery as set forth in claim 1;
said voltage detector connected to said one or more programmable processors; and
said current detector connected to said one or more programmable processors.

* * * * *